United States Patent [19]

Dash et al.

[11] Patent Number: 4,760,355

[45] Date of Patent: Jul. 26, 1988

[54] ELECTROMAGNETIC EMISSION CONTROL SYSTEM

[76] Inventors: Glen Dash, 16 Pierce Rd., Watertown, Mass. 02172; Isidor Straus, 8 Longfellow Rd., Wayland, Mass. 01778

[21] Appl. No.: 794,836

[22] Filed: Nov. 4, 1985

[51] Int. Cl.⁴ ............................................. H03H 7/06
[52] U.S. Cl. .................................... 333/12; 333/167; 333/172; 333/185
[58] Field of Search ...................... 333/12, 81 R, 81 A, 333/167, 172, 181–185, 236, 245

[56] References Cited

U.S. PATENT DOCUMENTS

| | | | |
|---|---|---|---|
| 2,368,474 | 1/1945 | Keister | 333/181 X |
| 3,191,132 | 6/1965 | Mayer | 333/184 |
| 3,516,026 | 6/1970 | Curran et al. | 333/12 |
| 3,551,858 | 12/1970 | Cielo | 333/81 X |
| 4,378,539 | 3/1983 | Swanson | 333/181 X |
| 4,506,235 | 3/1985 | Mayer | 333/12 |
| 4,519,664 | 5/1985 | Tillotson | 333/12 X |

OTHER PUBLICATIONS

Grant–"The Use and Misuse of Cores to Suppress Digital System Noise", Electronics, Jan. 18, 1971; pp. 77–80.

Primary Examiner—Marvin L. Nussbaum
Attorney, Agent, or Firm—Wolf, Greenfield & Sacks

[57] ABSTRACT

A ferrite sleeve or bead either in round configuration or square or rectangular configuration and either whole or split is employed as a means for reducing radiation emissions associated with a computer or the like data processing system. The ferrite system is disposed over the I/O cable either over a segment thereof or along the length thereof and in one embodiment is in the form of one or more ferrite beads that may be associated with wires internal to the data processing system. In a further embodiment of the invention the ferrite sleeve may be replaced by an equivalent circuit network comprising a parallel inductor and resistor in which the inductor is wound over a resistive core. The ferrite sleeve is dimensioned to have an impedance at the operating frequency greater than the signal cable conductor means radiation resistance, thus establishing a voltage divider circuit between the impedance of the ferrite sleeve and the radiation resistance, to thus reduce emissions due in particular to common mode noise.

6 Claims, 10 Drawing Sheets

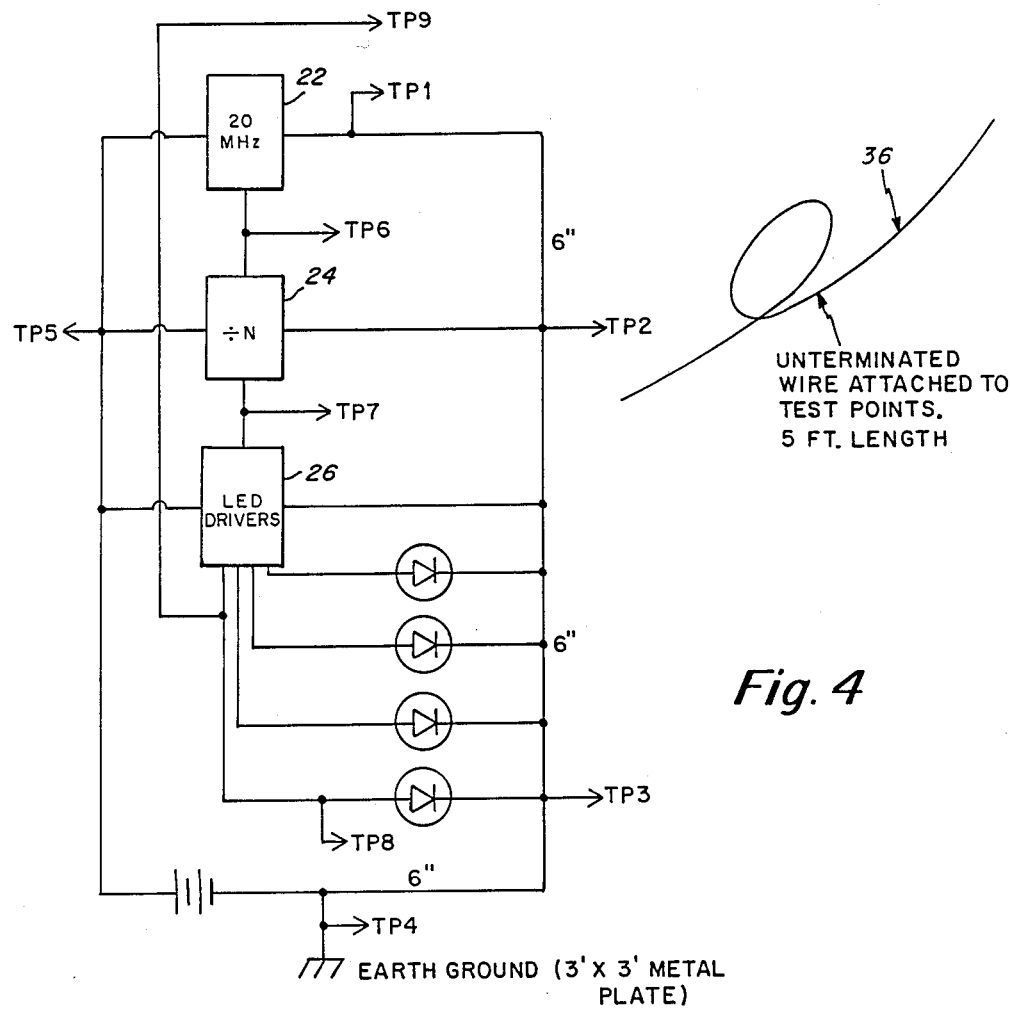

Fig. 4

EXPERIMENTAL TEST RESULTS
RADIATED EMISSIONS

| TEST POINT WIRE CONNECTED TO | READING ON FACE OF ANALYZER AT 60 MHz | ADD ANTENNA FACTOR | READING IN MICROVOLTS PER METER (TEST DISTANCE = 3 METERS) | LIMIT IN MICROVOLTS PER METER (TEST DISTANCE = 3 METERS) |
|---|---|---|---|---|
| NONE | −70dBm | 5dB | −65dBm=112 uV/m | 300uV/m |
| TP4 | −70dBm | 5dB | −65dBm=112 uV/m | 300uV/m |
| TP3 | −55dBm | 5dB | −50dBm=701uV/m | 300uV/m |
| TP2 | −51dBm | 5dB | −46dBm=1120uV/m | 300uV/m |
| TP1 | −46dBm | 5dB | −39dBm=2510 uV/m | 300 uV/m |
| TP6 | −37dBm | 5dB | −32dBm=5630uV/m | 300 uV/m |
| TP8 | −57dBm | 5dB | −52dBm=501 uV/m | 300 uV/m |

Fig. 5A
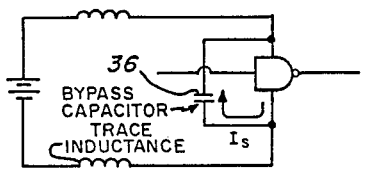
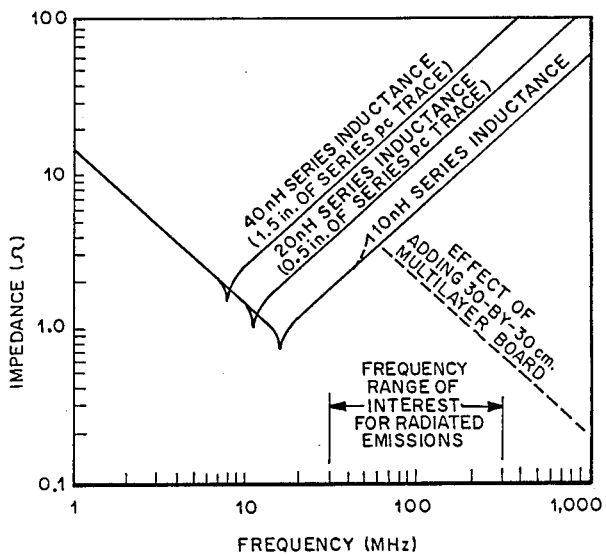
Fig. 5B
Fig. 5C
Fig. 6
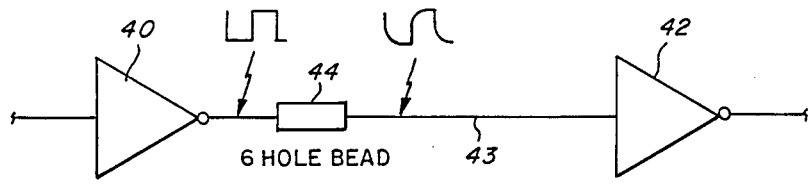
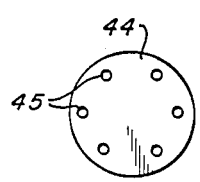
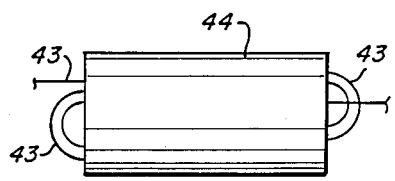
| NO. OF TURNS | SIGNAL FUNDAMENTAL FREQUENCY |
|---|---|
| 2½ TURNS | < 1 MHz |
| 1½ TURNS | 1 MHz – 10 MHz |

$1/F_1 = 4 \times$ CABLE LENGTH, FAR END OF CABLE UNGROUNDED $= 2 \times$ CABLE LENGTH FOR END OF CABLE GROUNDED $1/F_2 = 2 \times$ CABLE LENGTH FOR END OF CABLE UNGROUNDED

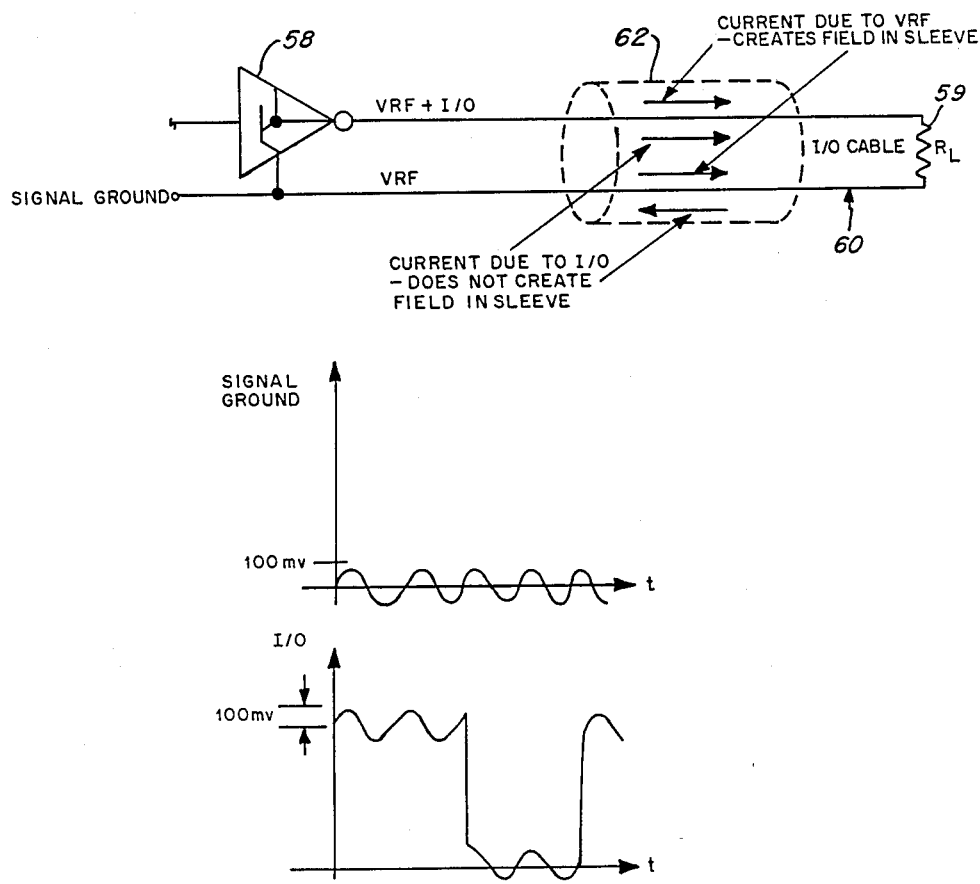
*Fig.12*
*Fig.13*
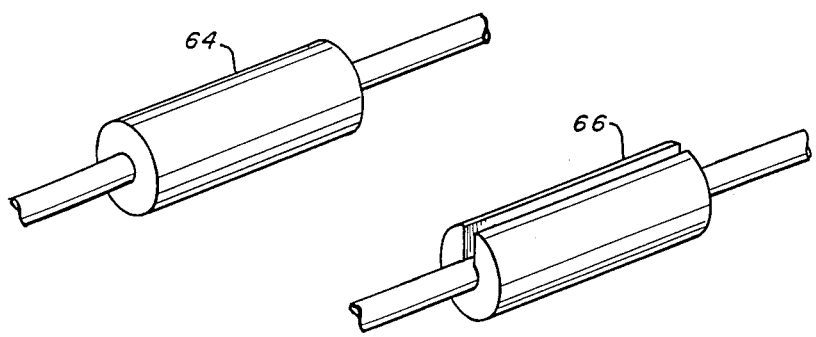

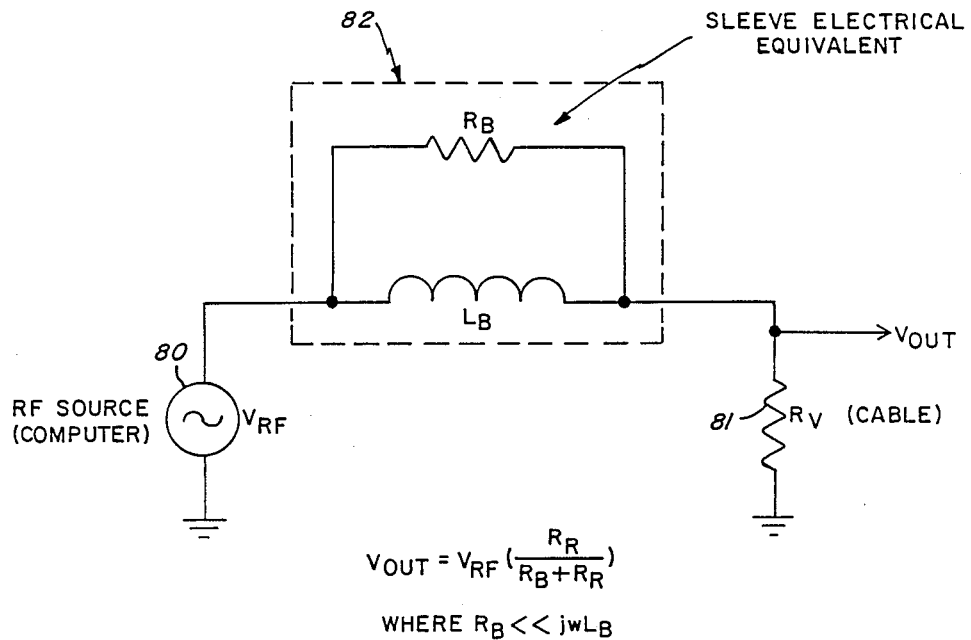
$$V_{OUT} = V_{RF} \left(\frac{R_R}{R_B+R_R}\right)$$
WHERE $R_B \ll jwL_B$
Fig. 16
Fig. 17
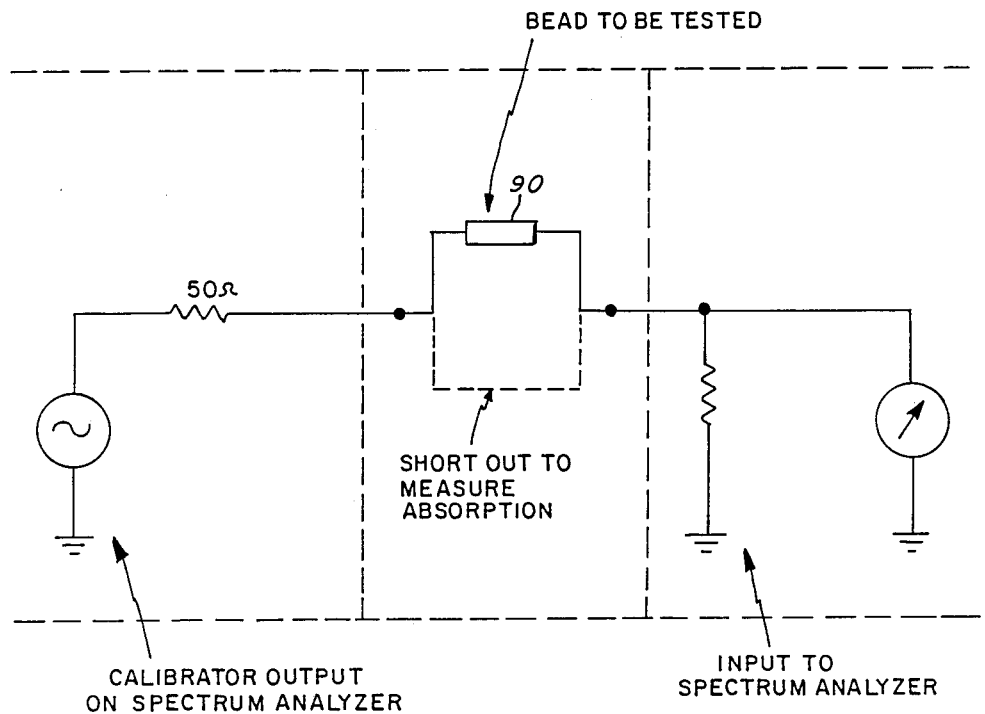

ELECTROMAGNETIC EMISSION CONTROL SYSTEM

BACKGROUND OF THE INVENTION

The present invention relates in general to a product that is used to reduce and preferably also diagnose electromagnetic emissions as particularly occur from electronic data processing equipment. More particularly, the invention is concerned with the use of ferrite-based materials for the reduction and diagnosis of emissions problems. Furthermore, in accordance with the present invention a substitute for ferrite-based materials is also derived.

Various government agencies have enacted regulations limiting the amount of emissions allowed from electronic data processing equipment. These regulations generally govern radiated signals between 30 and 1000 MHz. In the United States such regulations appear under FCC Rules, Part 15, Subpart J.

Electronic data processing equipment usually communicates to peripheral equipment via cables. The equipment contains devices such as clock oscillators, microprocessors, multiplexers and buffers, which produce a multiplicity of signals, such as square wave and sharp edge pulses. Generally, signals which are both high frequency (500 KHz or greater) and periodic tend to produce harmonics which can be detected by a nearby receiver, causing interference with licensed broadcast reception. Generally, the present state of the art limits the fastest high frequency, periodic signals generated by electronic data processing equipment to 20–100 MHz. The fundamental or harmonics of these signals causes the emissions which the rules are aimed at containing.

Generally, however, only the first few harmonics of these high frequency periodic signals have sufficient energy to cause emission problems. For most electronic data processing equipment in use today, emission problems are generally confined to frequencies below 300 MHz. Since the wavelength, at this frequency, is approximately one meter, the computers themselves are often not the primary source of the emissions. Although they contain high frequency periodic signals, they are usually not large enough to act as antennas. The primary "antennas" giving rise to radiated emissions are cables attached to the electronic data processing equipment.

The emissions are generally caused as follows: High frequency periodic signals, which are often due to the CPU clock, build up noise on inadequate ground rails (conductors). DC traces have inductance and therefore finite impedances at radio frequencies. RF currents passing through these inductances build up RF voltages. Devices using ground rails in common with clocks have these RF voltages incrementally coupled to their outputs. Therefore, cables attached to the equipment under test radiate with these clock derived RF energies.

I/O cables consist of a multiplicity of wires, each intentionally carrying its own signal. Radiated emissions, however, are primarily due to "common mode" noise, that is, the same unwanted RF noise appears on all the I/O leads. It is this unwanted RF noise which is the primary cause of emissions from data processing equipment. To a distant source, the cable is indistinguishable from a single wire, since all the wires have the same RF noise. Note that the digital signal which is intentionally sent down the cable is really differential in nature—return currents pass back down the ground wire in the cable.

Various techniques have been proposed for reducing these emissions, including bypassing (using decoupling capacitors) and shielded cables. Both of these schemes are described hereinafter in the detailed discussion. Both of these techniques have drawbacks. Bypass capacitors have inherent inductance limiting their effectiveness. Also, they must be carefully mounted so that their lead inductance is reduced. Shielded cables must have carefully designed backshells and be mounted directly against a metal chassis; otherwise, their effectiveness is limited. For these reasons, it has been necessary to develop other means for reducing emissions from I/O cables.

Accordingly, it is an object of the present invention to provide an improved means and system for reducing emissions from electronic data processing equipment and in particular from I/O cables associated therewith.

THE INVENTION

To accomplish the foregoing and other objects, features and advantages of the invention in a preferred embodiment in accordance with the invention the means for reducing emissions is in the form of one or more ferrite sleeves. These ferrite sleeves can be whole or split in order to allow easy mounting. They function as follows: It has been experimentally found that an RF quality (hard) ferrite of a length of 1.5 inches and a ratio of outside to inside diameter of 2.5 to 1 has an impedance of approximately 150 ohms at 100 MHz. A cable which is radiating as an antenna has a radiation resistance of approximately 50 ohms at resonance. By placing the ferrite sleeve at the base of the cable one can effectively create a voltage divider, reducing the emissions by a factor of 4, or approximately 12 dB. In accordance with the invention as indicated previously the ferrite is preferably a hard ferrite with a length of at least 1.5 inches in order to provide the proper impedance. It is also desired to have the ratio of outside to inside the diameter on the order of 2.5 to 1. This permits a 10 dB or greater reduction in emissions from cables attached to equipment under test.

A further use of ferrite sleeves is in the diagnosis of EMI problems. When measuring data processing equipment, it is often difficult to determine the cause of the emissions. By taking several ferrite sleeves and placing them over every exiting cable, including cables to the peripherals, keyboard, and a linecord, these sources can be eliminated as a source of interference. If the emissions are generated directly by the electronic data processing equipment, then cures for those emissions, such as shielding, bypassing or internal design changes, can be implemented. Furthermore, the ferrite sleeves can be removed from each cable one by one in order to find which cable causes the emissions. Also note that if two devices share a single cable, by placing the ferrite sleeves at either end of the cable and then removing the ferrite sleeves at one end and then the other, the source of the emissions can be determined.

Ferrite sleeves can be made in a round configuration, as mentioned previously. However, experimentally it has been discovered that square configurations also work. However, due to the magnetic path followed by the induced currents in the ferrite core, it is necessary for the finished part of the core to be at least one half inch long. Once again, ferrite sleeves can be whole or split.

Reference has been made hereinbefore to the "common mode" noise associated with the I/O cables. In this connection the use of a ferrite sleeve preserves the intended digital wave form and prevents "ground splitting". Differential signals are unaffected by the ferrite core placed over the entire cable. Therefore, the ferrite sleeve placed over the cable yields the best of both worlds—common mode suppression without affecting the intentional "differential" signal.

In accordance with the invention and individual ferrite beads can be used instead of a core over the entire cable. This arrangement attenuates both common mode and differential signals. Nonetheless, beads can be used effectively for common mode suppression.

Ferrite works as a lossy inductor. That is, at high frequencies it appears to be not just an inductor, but a resistor in parallel with an inductor. RF currents generated in the ferrite cause heat, and the heat dissipation shows up as a real resistance. For this reason, the impedance curves for ferrite flatten out at higher frequencies. This is a desirable characteristic. However, it is also possible to make a substitute for a ferrite bead using an inductor and a resistor. This has the disadvantage of raising a parts count, that is, two parts (and an inductor and a resistor) are needed to replace a single ferrite bead. In order to resolve this problem, it is possible to wind an inductor over a resistive core. Experimentally, it has been found that a 4.7 microhenry inductor wound over a 470 ohm resistor acts as an effective suppressing element, giving all the effectiveness of a ferrite bead, but having the advantage of reduced size.

BRIEF DESCRIPTION OF THE DRAWINGS

Numerous other objects, features and advantages of the invention should now become apparent upon a reading of the following detailed description taken in conjunction with the accompanying drawings in which:

FIG. 4 shows a circuit as illustrated in FIG. 2 along with associated tables illustrating test results relating to radiated emissions;

FIG. 5A illustrates a bipass capacitor 36 for reducing emissions;

FIG. 5B illustrates the inductance of the capacitor of FIG. 5A an associated printed wiring;

FIG. 5C illustrates an impedance versus frequency diagrams associated with FIGS. 5A and 5B;

FIG. 6 schematically illustrates the use of ferrite beads as used on wires internal to a PC board, also illustrating the details of a particular bead construction;

FIG. 12 illustrates the embodiment of a ferrite sleeve used over the entire I/O cable, also illustrating associated signal wave forms;

FIG. 13 illustrates two alternate forms of ferrite bead one being an split ferrite bead;

FIG. 16 is a schematic diagram illustrating the RF source for a computer and a cable as represented by a resistor; and FIG. 17 illustrates one technique for evaluating ferrite sleeves or beads.

DETAILED DESCRIPTION

Figure 1:
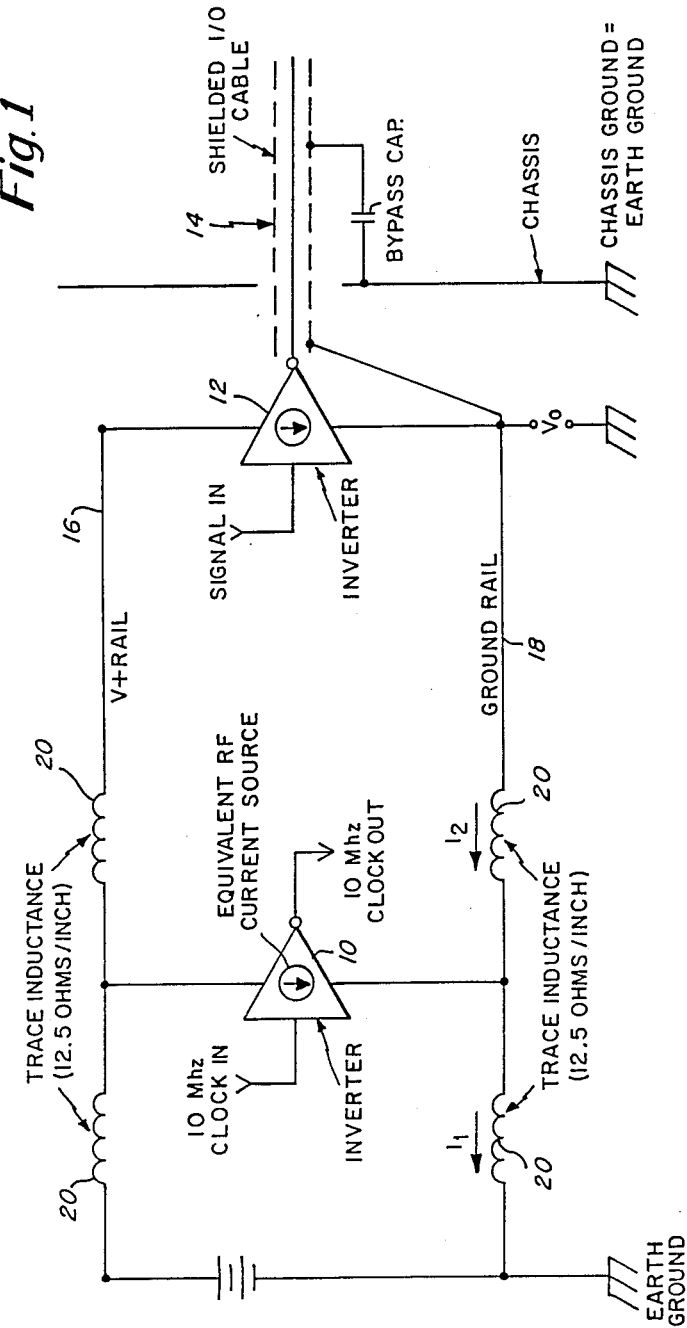
FIG. 1 is a circuit diagram of an inverter circuit coupling to a shielded I/O cable.

FIG. 1 is a diagram of a typical circuit illustrating inverters 10 and 12 with the output of inverter 12 coupling to a shielded I/O cable 14. In the diagram there is shown a positive voltage rail 16 and a ground rail 18 and there are also illustrated PC board traces represented by the inductances 20. Because square waves are made of a multiplicity of harmonics, the higher frequency harmonics of the current waveform that is generated builds up RF voltages on "logic ground". Although chassis ground may remain at zero volts relative to earth potential the higher frequency components of current time a trace impedance builds up significant RF potentials on logic ground. These potentials are incrementally coupled to the logic output and appear as "common mode" RF noise on the output. If any other devices share the same logic ground, they also exhibit the same common mode RF noise on their output.

Figure 2:
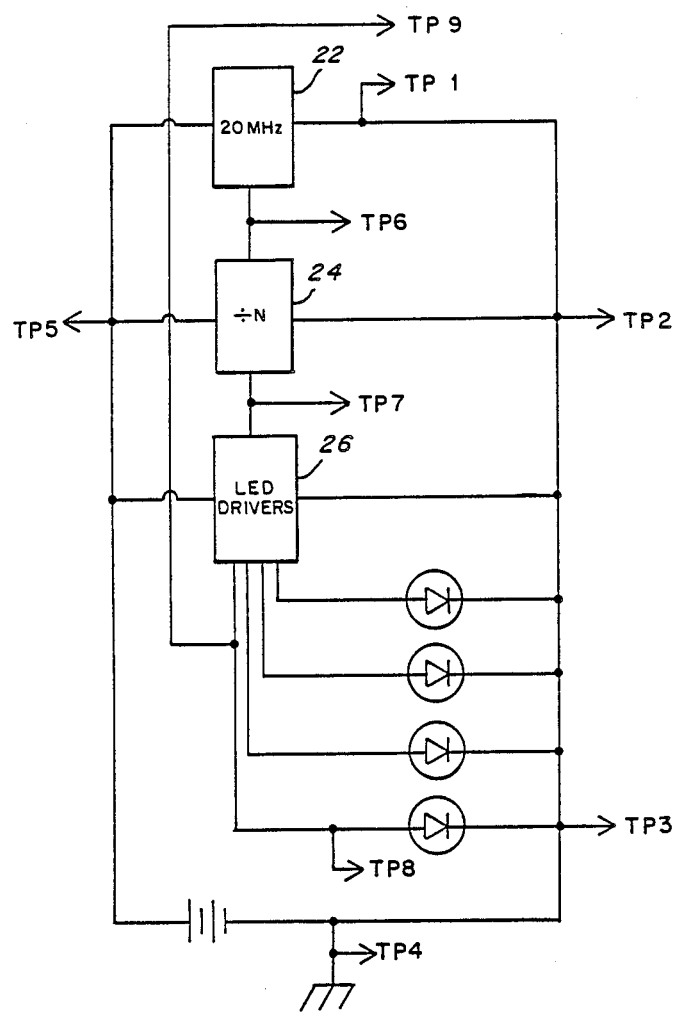
FIG. 2 is a circuit illustrating a simple digital device that forms part of a data processing system.

FIG. 2 is a circuit illustrating a simple digital device that forms part of a data processing system. In FIG. 2 there is illustrated a clock oscillator 22 which operates at 20 MHz and which drives a divide by N counter 24 which in turn drives the LED drivers 26. Of course, in most systems the clock 22 also drives additional circuitry including a microprocessor. However, for the purpose of simplicity the circuit of FIG. 2 has been simplified.

Figure 3:
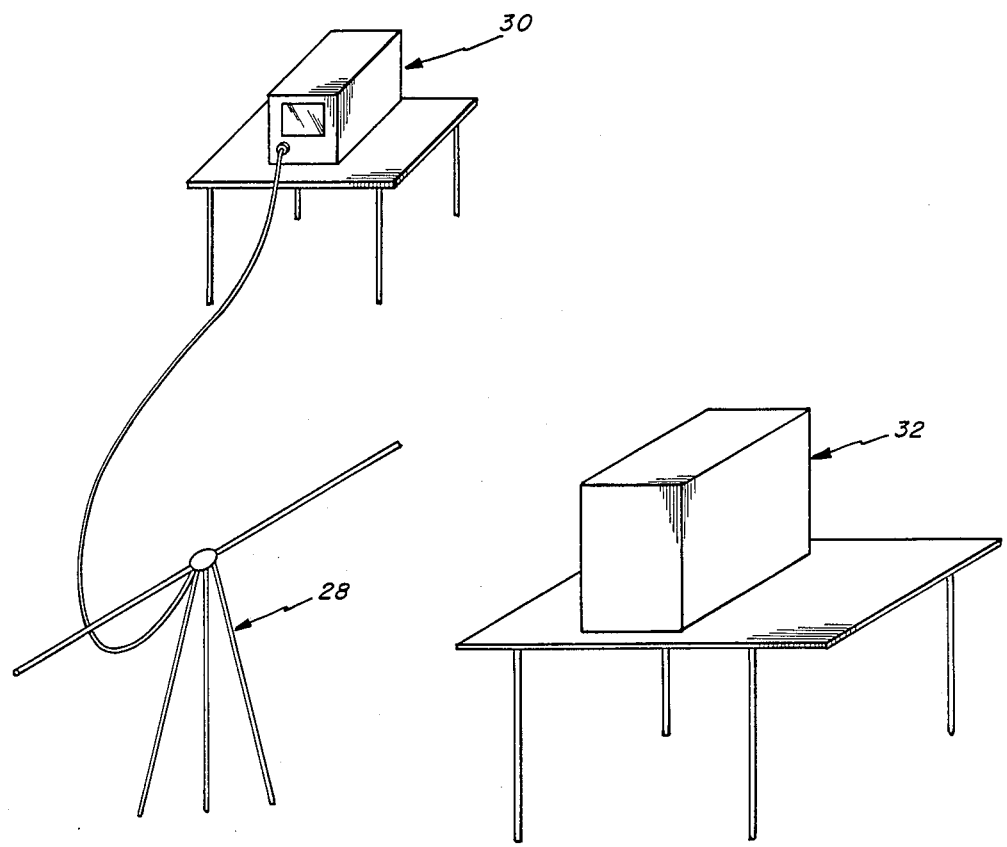
FIG. 3 is a proespective illustration of a test set up.

The purpose of FIG. 3 is to illustrate a set-up for testing. Radiated emissions are often tested using an antenna 28 connected to a spectrum analyzer or receiver 30. A computer 32 is mounted on a nearby table and emission tests are performed.

Reference is now made to FIG. 4 which shows substantially the identical circuit of FIG. 2 along with an associated table showing test results relating to radiated emissions. FIG. 4 also illustrates an unterminated wire 36 which may be of five foot length and is adapted to be attached to test points, in the circuit. These test points are identified by the designation "TP1, etc". By touching the wire 36 to various test points, the amount of emissions can be determined. Due to trace inductances, this particular circuit design exhibits the RF potentials illustrated using the test set-up of FIG. 3. Even in this relatively simple design, wires connected to ground at test point 1 and test point 2 exhibited emissions far over the FCC "class A" limit of Part 15, Subpart J. This illustrated that high frequency periodic signals produced by devices such as clock drivers built up RF potentials on the ground rail which caused common mode emissions.

FIG. 5 illustrates the use of a bypass capacitor to reduce emissions. FIG. 5A illustrates the bypass capacitor 36 and also illustrates trace inductance. In FIG. 5B there is shown the inductance of the capacitor and the printed wiring. This is capable of causing a 0.01 micropheric capacitor to exhibit high impedances at frequencies of interest as illustrated in FIG. 5C. As indicated previously, the use of bypass capacitors can be used to reduce emissions. However, they are limited to effectiveness due to their series inductance. The graph of FIG. 5C shows the series inductance when small lengths of printed circuit traces are added in series with the capacitor. Because of this effect, bypass capacitors are of limited effectiveness in reducing emissions.

Reference is now made to FIG. 6 which shows the use of ferrite beads. In this connection note in FIG. 6 the inverter circuits 40 and 42 and the conductor 43 therebetween. Associated with the conductor 43 is a six hole ferrite bead 44. This bead 44 is also shown inside and in the views of FIG. 6 with the illustrated six holes 45. The drawing also illustrates the conductor 43 looping through the holes with a predetermined number of turns.

Thus, in the particular embodiment of FIG. 6 ferrite beads are used on wires internal to the PC board. Ferrite beads can be used not only on I/O cables but also on such wires that are internal to the PC board itself. By placing the ferrite bead close to a device generating high frequency periodic signals, the edges of the signal can be rolled off as illustrated by the waveform in FIG. 6 thus significantly reducing the higher frequency harmonics, while leaving the low frequency energy in tact. As a rule of thumb, using a six hole ferrite bead, as illustrated, the number of currents through the bead can be varied to accommodate the roll-off of high frequency signals without impairing the functioning of the logic itself.

Figure 7:
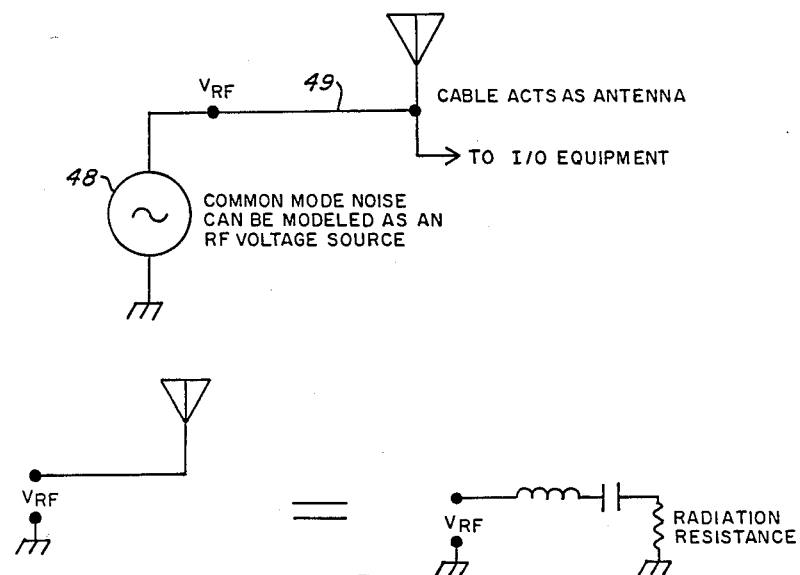
FIG. 7 schematically illustrates the modelling of a computer as a source of common mode noise.

FIG. 7 shows that a computer can be modeled as a source of common mode noise. This is illustrated in FIG. 7 by the source 48. FIG. 7 also illustrates the cable 49 functioning as an antenna. This has a radiation resistant circuit as illustrated in FIG. 7. The I/O cables being the longest geometrical objects attached to the computer function as an antenna. An antenna can be modeled as a complex impedance as illustrated in FIG. 7. The actual radiation into space is modeled as a radiation resistance. When not tuned to resonance, the antenna is inefficient because the inductive and capacitive elements have a large impedance (in this series model) with respect to the radiation resistance. Therefore, not much energy gets into the radiation resistance.

Figure 8:
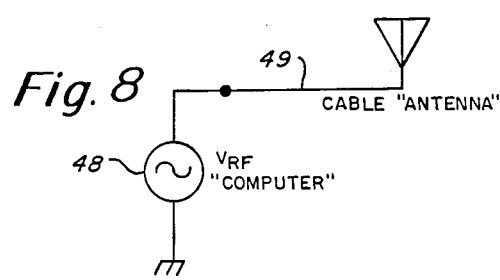
FIG. 8 illustrates the computer model.
Figure 9:
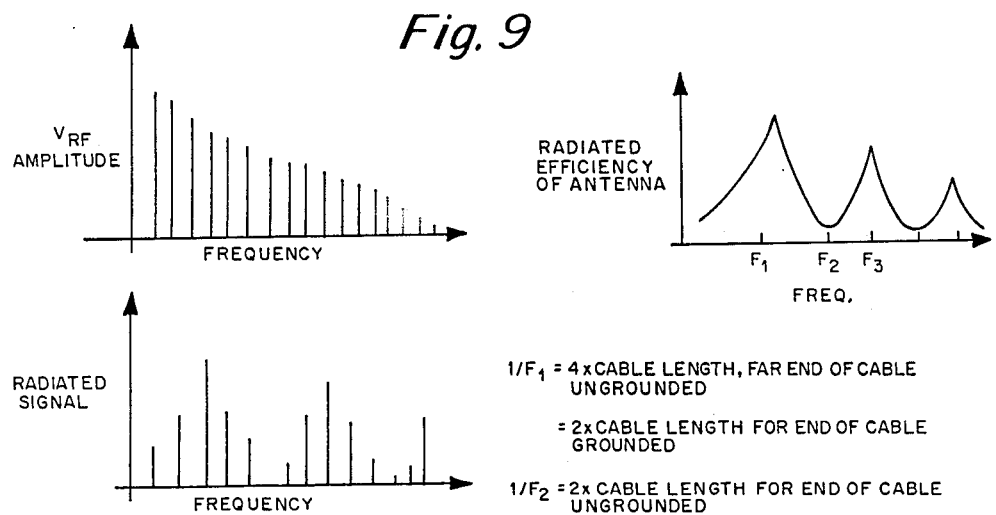
FIG. 9 illustrates a series of frequency diagrams associated with FIGS. 7 and 8.

In this regard also refer to FIG. 8 which shows the computer model. Since the computer creates harmonics which generally fall off with frequency, and since the cable antenna is resonant at certain frequencies proportional to its length and also a function of its positioning, the actual radiated signal varies as a function of both the nature of the computer and the orientation and length of its I/O cable. Moving the cable shifts the frequency of the radiated emission piece. FIG. 9 shows these radiated peaks.

Figure 10:
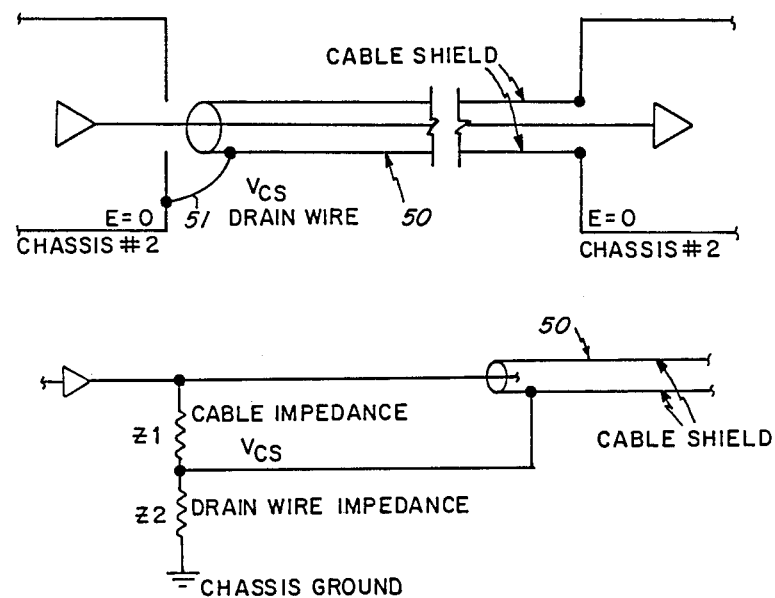
FIG. 10 schematically illustrates shielded cable and associated representative circuit diagram.

FIG. 10 illustrated shielded cables at 50. Shielded cables can be of limited effectiveness due to physical limitations on the connection of the shield on the cable to the chassis. Wires, as mentioned previously, have finite impedances at radial frequencies (on the order of 10-20 nanohenries per inch). The wire, known as a "drain" wire attached from the shield to the chassis and illustrated at 51 in FIG. 10 causes a voltage divider effect between the characteristic impedance of the cable (generally between 50 and 300 ohms) and the chassis itself, which usually remains at earth ground potential. Because of this, significant RF voltages can build up on the shield, which then radiates. In many applications, the construction of the cable boot, that is, the portion that connects the cable to the chassis can make this "drain wire impedance" minimal, and therefore made the shield cable affective. However, such connection is not possible with many computer designs and thus this form of emission reduction is not always effective.

Figure 11:
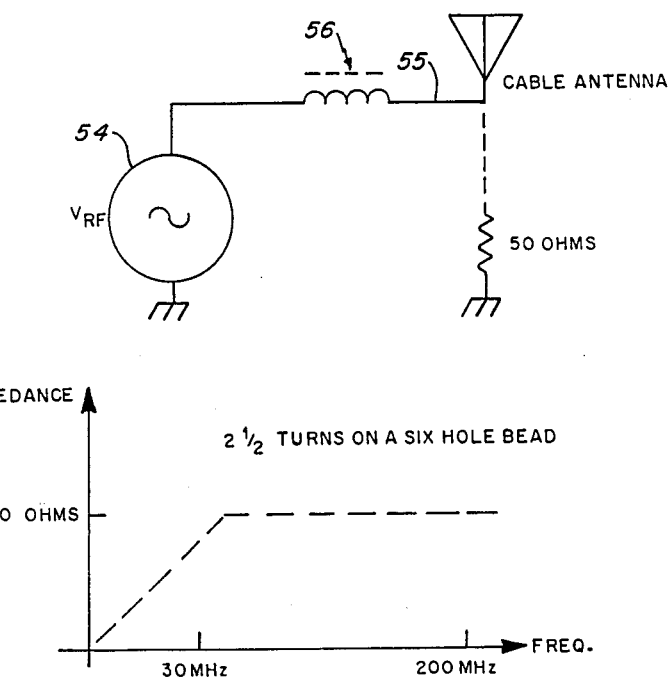
FIG. 11 illustrates the computer model source and cable antenna.

FIG. 11 also illustrates the computer model source 54 and cable antenna 55. Now, in FIG. 11 there added the ferrite bead or element 56. By adding a ferrite bead in series with an I/O cable, a voltage divider is created between the cable antennas, radiation resistance and the beads impedance. Note the 50 ohm resistor in FIG. 11 illustrating the cable antennas radiation resistance. FIG. 11 also shows the graph of impedance versus frequency.

A ferrite bead functions with minimal degradation of the intended signal to be sent down the line, since, at low frequencies, it has a low impedance which rises with frequency and then flattens as the bead becomes lossy. Note the flattened curve at higher frequencies in FIG. 11 this flattening characteristic limits the amount of ringing which could impair digitial signal transmissions.

FIG. 12 illustrates the situation in which a ferrite sleeve may be used over the entire I/O cable. Thus, in FIG. 12 there is illustrated the signal circuit 58 and the load resistor 59 along with the I/O cable 60. FIG. 12 also shows a dotted outline of the ferrite sleeve 62. A ferrite sleeve added over an entire cable will effectively pick off the common mode signal without affecting the differential signal. The intended signal, which returns on the ground wire, creates currents which cancel on the core, and therefore is not effected by the presence of the core. The common mode signal, however, does create currents in the core which cause the core to act as a series impedance, reducing emissions.

FIG. 13 illustrates a form of whole ferrite bead 64 and also an alternate embodiment in which the split ferrite 66 is used. With regard to either the whole or split ferrite sleeve, it has been found that in RF quality hard ferrite of a length of 1.5 inches in the ratio of outside to inside diameter of on the order of 2.5 to 1 has an impedance of approximately 150 ohms at 100 MHz. A cable which is radiating as an antenna has a radiation resistance of approximately 50 ohms at resonance. By placing the ferrite sleeve at the base of the cable one thus effectively creates a voltage divider, reducing the emissions by a factor of 4 or approximately 12 dB. Therefore, it has been found in accordance with the invention that the ferrite sleeve is preferably of a length of at least 1.5 inches and preferably in the diameter ratio indicated so as to provide the proper emission reduction.

Figure 14:
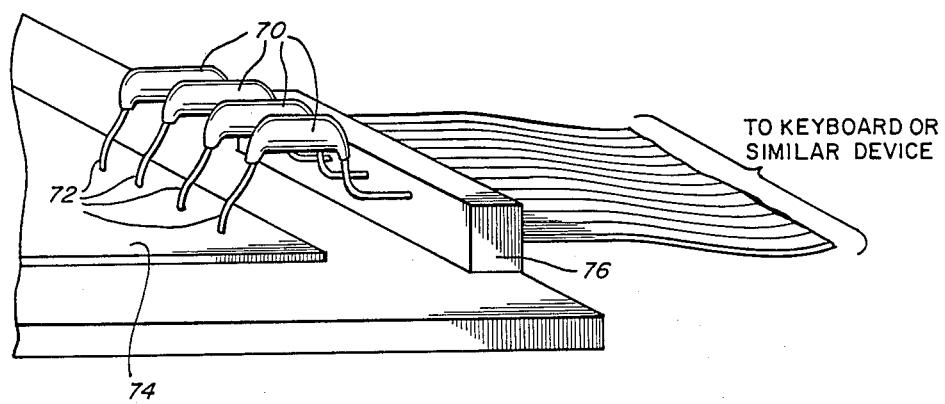
FIG. 14 illustrates the use of individual ferrite beads inserted in series with individual signal lines.

FIG. 14 illustrates the use of individual ferrite beads 70 which are inserted in series with individual signal lines 72 for reducing the emissions. FIG. 14 illustrates these ferrite beads as connecting between the present circuit board 74 and a terminal bloc 76.

Figure 15:
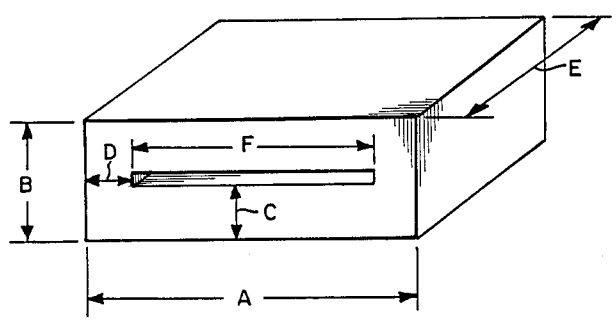
FIG. 15 illustrates an alternate ferrite bead construction for use with flat cables.

In the previous drawing there has been illustrated the preferred ferrite sleeve which of generally cylindrical construction. However, ferrite sleeves can also be designed to be square or rectangular to fit over flat cables as illustrated in FIG. 15. In this regard an with regard to the dimensions illustrated in FIG. 15, one of the important parameters is the dimension D. Because the magnetic fields are created perpendicular to the cable, the effective width of the bead is limited by the smallest dimension which in this case is the dimension D in FIG. 15. To be effective for computing equipment, the beads should be of the dimension shown in the table in FIG.

15 for two inch wide conductors (conventional 40 conductor ribbon cable) and three inch wide conductors.

FIG. 16 shows a schematic diagram illustrating the RF source or a computer 80 and the cable as represented by the resistor 81. FIG. 16 also shows the ferrite bead as an equivalent circuit at 82. The ferrite beads are equivalent to an inductor with a parallel resistance as illustrated in FIG. 16. At high frequencies, the resistance shorts out the inductive element and also reduces ringing. Thus, it is possible to make a substitute for a ferrite bead using an inductor and a resistor as illustrated in FIG. 16. This has the advantage of raising the parts count. However, it is possible to wind and inductor over a resistive core. Experimentally, it has been found that a 4.7 microhenry inductor wound over a 470 ohm resistor functions as an effective suppressing element, giving all the effectiveness of a ferrite bead but having the advantage of reduced size.

FIG. 17 illustrates one way to evaluate ferrite sleeves or beads. In FIG. 17 there is shown the calibrator output on a spectrum analyzer or receiver which is used to drive the bead under test. The bead is illustrated at 90. This bead is wired to the input of the same spectrum analyzer or receiver. Because the calibrator output and input to the spectrum analyzer use the same ground, the test set-up can accurately predict the impedance of a ferrite bead. An impedance significantly greater than 50 ohms indicates that it will be effective in reducing common mode emissions.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. In a data processing system having signal cable conductor means associated therewith for carrying electrical signals between components comprising the system, the improvement comprising a ferrite sleeve disposad over at least a partial length of the signal cable conductor means, said ferrite sleeve dimensioned to have an impedance at the operating frequency greater than the signal cable conductor means radiation resistance, thus establishing a voltage divider circuit between the impedance of the ferrite sleeve and the radiation resistance, to thus reduce emssions due to common mode noises, said ferrite sleeve having a length of at least 1.5 inches, said ferrite sleeve having a substantially centrally disposed hole therethrough and having a ratio of outside to inside diameter of on the order of 2.5 to 1 so as to provide an impedance of approximately 150 ohms at 100 MHz, said ferrite sleeve providing a reduction in emissions on the order of at least 10 dB.

2. The system of claim 1 in which said ferrite sleeve is of round configuration.

3. The system of claim 2 wherein the ferrite sleeve is whole.

4. The system of claim 2 wherein the ferrite sleeve is split.

5. In a data processing system having signal cable conductor means associated therewith for carrying electrical signals between components comprising the system, the improvement comprising a ferrite bead disposed over at least a partial length of the signal cable conductor means, said ferrite bead dimensioned to have an impedance at the operating frequency greater than the signal cable conductor means radiation resistance, thus establishing a voltage divider circuit between the impedance of the ferrite bead and the radiation and resistance, said ferrite bead having a length of at least 1.5 inches, said ferrite bead dimensioned to have an impedance of at least 150 ohms, said ferrite bead haivng multiple spaced longitudinally extending holes disposed therein, said signal cable conductor means looping with plural turns through the multiple longitudinally extending holes in the ferrite bead.

6. In a data processing system having signal cable conductor means associated therewith, for carrying electrical signals between components comprising the system, the improvement comprising an emission reduction network comprising an inductor and resistor coupled in parallel providing a network that establishes a voltage divider circuit between the inductor/resistor thereof and the signal cable conductor means radiation resistance, wherein the inductor is wound over a resistive core forming said resistor, wherein the inductor has a value on the order of 4.7 microhenry and the resistor has a value on the order of 470 ohms, said emission reduction network formed about said signal cable conductor means.

* * * * *